(12) United States Patent
Kitabayashi

(10) Patent No.: US 11,289,562 B2
(45) Date of Patent: Mar. 29, 2022

(54) DISPLAY APPARATUS HAVING HIGH RESOLUTION

(71) Applicant: SAMSUNG DISPLAY CO., LTD., Yongin-si (KR)

(72) Inventor: Atsushi Kitabayashi, Hwaseong-si (KR)

(*) Notice: Subject to any disclaimer, the term of this patent is extended or adjusted under 35 U.S.C. 154(b) by 0 days.

(21) Appl. No.: 16/871,116

(22) Filed: May 11, 2020

(65) Prior Publication Data

US 2020/0365673 A1      Nov. 19, 2020

(30) Foreign Application Priority Data

May 17, 2019   (KR) .......................... 10-2019-0058093

(51) Int. Cl.
*H01L 27/32*      (2006.01)

(52) U.S. Cl.
CPC ...... *H01L 27/3262* (2013.01); *H01L 27/3218* (2013.01); *H01L 27/3246* (2013.01)

(58) Field of Classification Search
CPC ............. H01L 27/3262; H01L 27/3218; H01L 27/3246
USPC ......................................................... 257/40
See application file for complete search history.

(56) References Cited

U.S. PATENT DOCUMENTS

| | | | |
|---|---|---|---|
| 9,640,589 B2 | 5/2017 | Wang | |
| 2006/0290870 A1* | 12/2006 | Kwak | H01L 27/3218 349/144 |
| 2007/0024183 A1* | 2/2007 | Lih | H01L 51/56 313/504 |
| 2008/0049048 A1* | 2/2008 | Credelle | G09G 3/2074 345/690 |
| 2010/0156279 A1* | 6/2010 | Tamura | H01L 27/3211 313/504 |
| 2016/0043150 A1* | 2/2016 | Wang | H01L 51/56 257/40 |

FOREIGN PATENT DOCUMENTS

| | | |
|---|---|---|
| CN | 10-5720074 | 6/2016 |
| KR | 10-2006-0008134 | 1/2006 |
| KR | 10-1347995 | 12/2013 |

OTHER PUBLICATIONS

English Machine Translation of JP 2017/022068 (Year: 2017).*

* cited by examiner

*Primary Examiner* — Dzung Tran
(74) *Attorney, Agent, or Firm* — F. Chau & Associates, LLC

(57) ABSTRACT

A display apparatus includes pixel units each of which includes a first light emitting portion, a second light emitting portion, and a third light emitting portion, each emitting a different color light. The display apparatus includes a thin film transistor substrate, a first light emitting group disposed on the thin film transistor substrate and including eight first light emitting portions included in different pixel units, a second light emitting group disposed on the thin film transistor substrate and including eight second light emitting portions included in different pixel units, and a third light emitting group disposed on the thin film transistor substrate and including four third light emitting portions included in different pixel units.

17 Claims, 9 Drawing Sheets

DISPLAY APPARATUS HAVING HIGH RESOLUTION

CROSS-REFERENCE TO RELATED APPLICATION

This application claims priority under 35 U.S.C. § 119 to Korean Patent Application No. 10-2019-0058093, filed on May 17, 2019 in the Korean Intellectual Property Office, the disclosure of which is incorporated by reference herein in its entirety.

TECHNICAL FIELD

Exemplary embodiments of the inventive concept relate to a display apparatus. More particularly, exemplary embodiments of the inventive concept relate to a display apparatus capable of improving a resolution thereof.

DISCUSSION OF RELATED ART

Previously, cathode ray tube (CRT) display apparatuses had been commonly used due to performance and competitive prices. However CRT display apparatuses have weaknesses with regards to size and portability. Recently, display apparatuses having light weight and small size have been manufactured. Display apparatuses such as plasma display apparatuses, liquid crystal display apparatuses, and organic light emitting display apparatuses have been highly regarded due to small size, light weight, and low power consumption.

A display apparatus may include a plurality of pixel units arranged in a matrix to display an image. One pixel unit may include a red sub pixel that emits red light, a green sub pixel that emits green light, and a blue sub pixel that emits blue light, which are driven separately.

In an organic light emitting diode display apparatus, light emitting layers constituting the sub pixels may be formed through various methods. There is a difficulty in forming patterns of the light emitting layers as a resolution of the display apparatus increases.

SUMMARY

According to an exemplary embodiment of the inventive concept, a display apparatus includes pixel units each of which includes a first light emitting portion, a second light emitting portion, and a third light emitting portion, each emitting a different color light. The display apparatus includes a thin film transistor substrate, a first light emitting group disposed on the thin film transistor substrate and including eight first light emitting portions included in different pixel units, a second light emitting group disposed on the thin film transistor substrate and including eight second light emitting portions included in different pixel units, and a third light emitting group disposed on the thin film transistor substrate and including four third light emitting portions included in different pixel units.

In an exemplary embodiment of the inventive concept, the first light emitting group, the second light emitting group, and the third light emitting group may be formed in plural as first light emitting groups, second light emitting groups, and third light emitting groups, respectively, and arranged in a matrix form along a first direction and a second direction crossing the first direction on the thin film transistor substrate. The number of the third light emitting groups per unit area may be twice the number of the first or second light emitting groups.

In an exemplary embodiment of the inventive concept, centers of two light emitting groups adjacent to each other among the first to third light emitting groups may be spaced apart from each other by a first distance. A distance between centers of two of the first light emitting groups closest to each other may be a second distance which is twice the first distance.

In an exemplary embodiment of the inventive concept, the first light emitting portion, the second light emitting portion, and the third light emitting portion arranged closest to one another form one pixel unit.

In an exemplary embodiment of the inventive concept, the first light emitting portion, the second light emitting portion, and the third light emitting portion of the one pixel unit may be arranged in a triangular shape.

In an exemplary embodiment of the inventive concept, the triangular shape may be a right isosceles triangle.

In an exemplary embodiment of the inventive concept, the first light emitting portion may emit green light, the second light emitting portion may emit red light, and the third light emitting portion may emit blue light.

In an exemplary embodiment of the inventive concept, the third light emitting portion may emit red light or green light.

In an exemplary embodiment of the inventive concept, a distance between centers of two of the third light emitting groups closest to each other may be larger than the first distance and smaller than the second distance.

In an exemplary embodiment of the inventive concept, the first light emitting group may include eight pixel electrodes corresponding to the eight first light emitting portions, one light emitting layer overlapping all of the eight pixel electrodes, and an opposite electrode overlapping the one light emitting layer.

In an exemplary embodiment of the inventive concept, the first light emitting group may have a circular or polygonal shape.

In an exemplary embodiment of the inventive concept, the display apparatus may further include a light emitting group defining layer disposed on the thin film transistor substrate and having an opening. The one light emitting layer may be disposed in the opening of the light emitting group defining layer.

In an exemplary embodiment of the inventive concept, the display apparatus may further include a light emitting portion defining layer disposed in the opening of the light emitting group defining layer. The light emitting portion defining layer may be disposed between adjacent pixel electrodes of the eight pixel electrodes.

In an exemplary embodiment of the inventive concept, the light emitting group defining layer may include a liquid repellent material. The light emitting portion defining layer may include a lyophilic material.

In an exemplary embodiment of the inventive concept, the one light emitting layer may be formed by inkjet printing.

In an exemplary embodiment of the inventive concept, one of the first light emitting group, the second light emitting group, and the third light emitting group may be different in size from the other two.

In an exemplary embodiment of the inventive concept, each of the first to third light emitting groups may have a circular shape.

According to an exemplary embodiment of the inventive concept, a display apparatus includes a plurality of pixel units each including a first light emitting portion, a second light emitting portion, and a third light emitting portion which emit different color light. The display apparatus includes a thin film transistor substrate, a first pixel electrode and a second pixel electrode disposed on the thin film transistor substrate, a light emitting group defining layer disposed on the thin film transistor substrate and having an opening, a light emitting layer overlapping the first and second pixel electrodes, and disposed in the opening of the light emitting group defining layer, and an opposite electrode disposed on the light emitting layer. The first pixel electrode and the second pixel electrode may be included in the first light emitting portions of two different pixel units.

In an exemplary embodiment of the inventive concept, the display apparatus may further include a light emitting portion defining layer disposed in the opening of the light emitting group defining layer. The light emitting portion defining layer may be disposed between the first electrode and the second pixel electrode. The light emitting group defining layer may include a liquid repellent material, and the light emitting portion defining layer may include a lyophilic material.

In an exemplary embodiment of the inventive concept, the first light emitting portion, the second light emitting portion, and the third light emitting portion of one pixel unit may be arranged in a triangular shape.

According to an exemplary embodiment of the inventive concept, a display apparatus has a display area including first, second, third, and fourth columns arranged sequentially in a first direction and first, second, third, and fourth rows arranged sequentially in a second direction crossing the first direction. The display apparatus includes first light emitting groups disposed only in the first and third rows and only in the first and third columns, second light emitting groups disposed only in the second and fourth rows and only in the second and fourth columns, and third light emitting groups disposed in the first to fourth rows and the first to fourth columns. Each of the third light emitting groups is disposed between adjacent light emitting groups of the first light emitting groups. The first, second, and third light emitting groups emit different color light. A number of light emitting portions included in each of the third light emitting groups is less than a number of light emitting portions included in each of the first light emitting groups.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
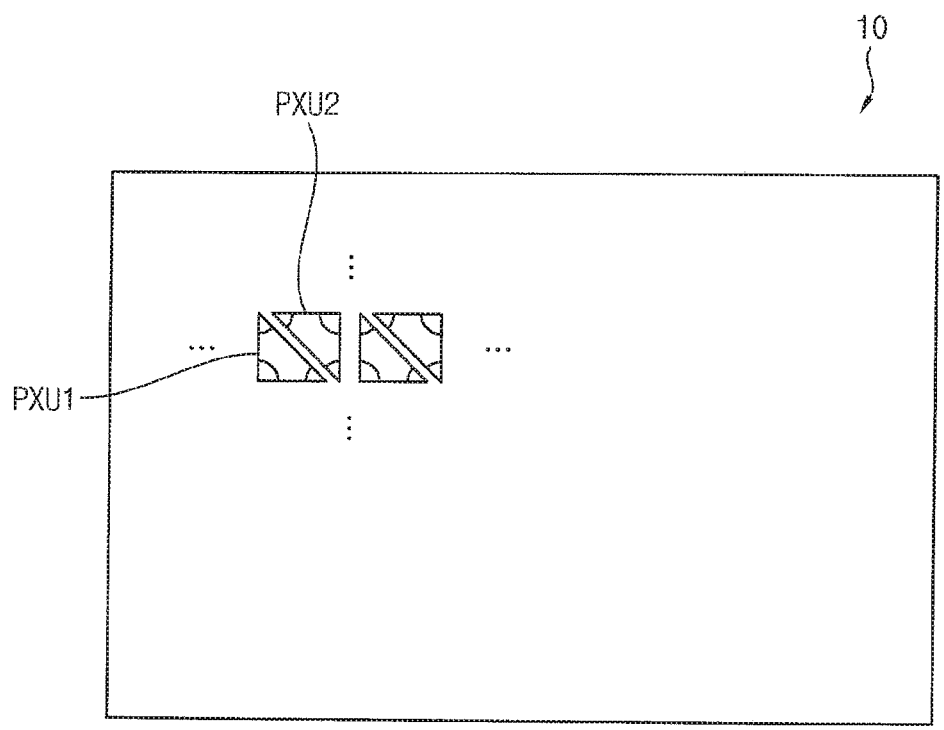
FIG. 1 is a plan view illustrating a display apparatus according to an exemplary embodiment of the inventive concept.

Exemplary embodiments of the inventive concept provide a display apparatus capable of improving a resolution thereof.

Hereinafter, exemplary embodiments of the inventive concept will be explained in detail with reference to the accompanying drawings. Like reference numerals may refer to like elements throughout this application.

FIG. 1 is a plan view illustrating a display apparatus according to an exemplary embodiment of the inventive concept.

Referring to FIG. 1, a display apparatus 10 may include a plurality of pixel units PXU1 and PXU2 disposed in a display area in which an image is displayed. The pixel units PXU1 and PXU2 may be repeatedly arranged along a first direction D1 and a second direction D2 substantially perpendicular to the first direction D1.

Each of the pixel units PXU1 and PXU2 may include a first sub pixel, a second sub pixel, and a third sub pixel emitting different color light. For example, the first sub pixel may emit green light, the second sub pixel may emit red light, and the third sub pixel may emit blue light. Corresponding to each sub-pixel, a light emitting portion for emitting each color light may be disposed.

For example, a first light emitting portion (see G of FIG. 2) may be formed corresponding to the first sub pixel, a second light emitting portion (see R of FIG. 2) may be formed corresponding to the second sub pixel, and a third light emitting portion (see B of FIG. 3) may be formed corresponding to the third sub pixel.

As illustrated, one pixel unit PXU1 or PXU2 may have a triangular shape including two short sides extending in the first direction D1 and the second direction D2. For example, the first pixel unit PXU1 may have a triangular shape consisting of a bottom side extending in the first direction D1, a side extending in the second direction D2 and perpendicular to the bottom side, and a hypotenuse. The first pixel unit PXU1 and the second pixel unit PXU2 adjacent to each other in the first direction D1 may have triangular shapes with their hypotenuses facing each other.

As described above, each of the pixel units PXU1 and PXU2 may include the first light emitting portion, the second light emitting portion, and the third light emitting portion emitting different color light.

A detailed arrangement of the light emitting portions will be described below in detail with reference to FIG. 2.

The display apparatus 10 may further include a plurality of gate lines and a plurality of data lines crossing the gate lines. The gate lines may extend in the first direction D1, and the data lines may extend in the second direction D2. The sub pixels of the pixel units PXU1 and PXU2 may be electrically connected to the gate lines and the data lines.

Figure 3A:
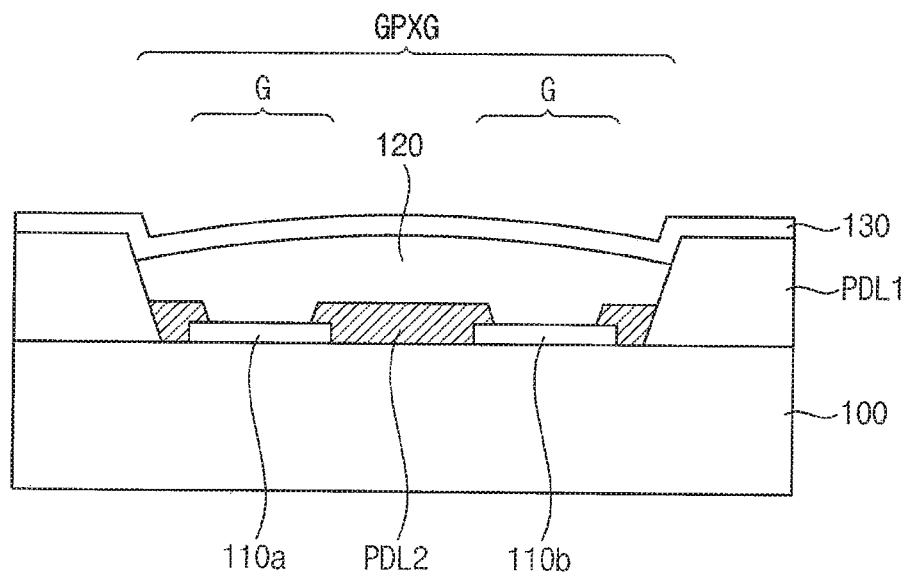
FIG. 3A is a cross-sectional view corresponding to one first light emitting group of the display apparatus of FIG. 2 according to an exemplary embodiment of the inventive concept.

Each sub pixel may include a switching element and a light emitting structure (see pixel electrodes 110a and 110b, a light emitting layer 120, and an opposite electrode 130 shown in FIG. 3A) electrically connected to the switching element.

Figure 2:
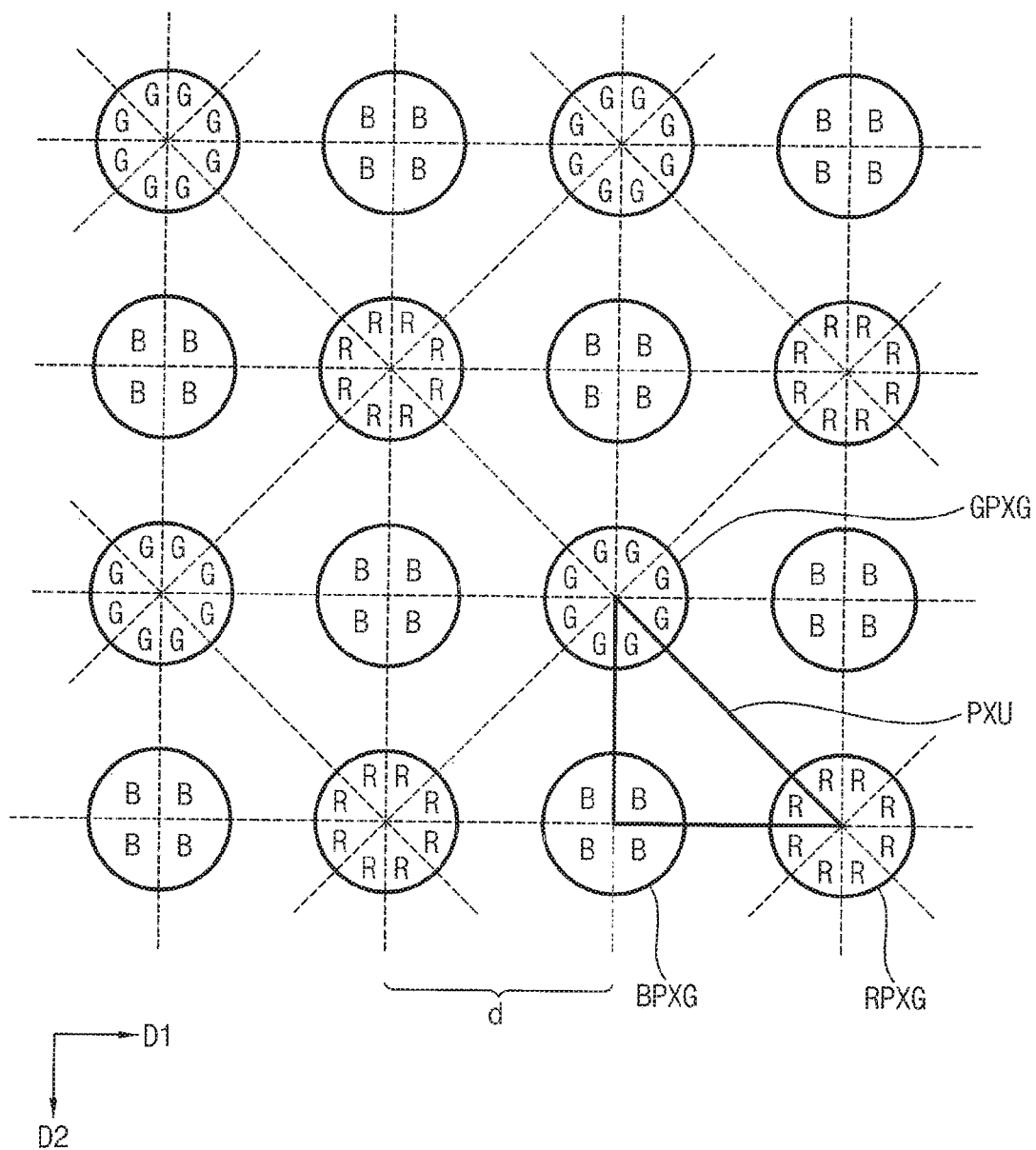
FIG. 2 is a plan view illustrating a portion of an arrangement of pixel units of the display apparatus of FIG. 1 according to an exemplary embodiment of the inventive concept.

FIG. 2 is a plan view illustrating a portion of an arrangement of pixel units of the display apparatus of FIG. 1 according to an exemplary embodiment of the inventive concept.

Referring to FIG. 2, the display apparatus 10 may include a first light emitting group GPXG, a second light emitting group RPXG, and a third light emitting group BPXG arranged in a predetermined order along the first direction D1 and the second direction D2 crossing the first direction D1.

In other words, the first light emitting group GPXG, the second light emitting group RPXG, and the third light emitting group BPXG may be formed in plural, and arranged in the first and second directions D1 and D2 to form a matrix shape.

Here, centers of two light emitting groups, adjacent to each other among the first to third light emitting groups GPXG, RPXG, and BPXG arranged in the matrix form, may be spaced apart by a first distance d.

In addition, a distance between centers of two groups of the first light emitting portion GPXG closest to each other in the first direction D1 is a second distance 2d that is twice of the first distance d. When the first light emitting group GPXG, the second light emitting group RPXG, and the third light emitting group BPXG are disposed at regular intervals from one another, a distance between centers of the two first light emitting groups GPXG closest to each in the second direction D2 other may also be the second distance 2d. In this case, the four first light emitting group GPXG closest to one another may be arranged in a square shape. The first light emitting groups GPXG may be arranged in a repeating quadrangular shape.

In addition, a distance between centers of two groups of the second light emitting groups RPXG closest to each other in the first direction D1 may also be the second distance 2d. When the first light emitting group GPXG, the second light emitting group RPXG, and the third light emitting group BPXG are arranged at regular intervals from each other, a distance between centers of the two groups of the second light emitting groups RPXG closest to each other in the second direction. D2 may also be the second distance 2d. In this case, the four second light emitting groups RPXG closest to each other may be arranged in a square shape. The second light emitting groups RPXG may be arranged in a repeating quadrangular shape.

Meanwhile, a distance between centers of two groups of the two third light emitting groups BPXG closest to each other may be greater than the first distance d and smaller than the second distance 2d. For example, when the first light emitting groups GPXG and the second light emitting groups RPXG are arranged in a square shape, the third light emitting groups BPXG may be arranged in a square shape inclined by 45 degrees with respect to the first and second directions D1 and D2. A distance between centers of the two groups of the two third light emitting groups BPXG closest to each other may be √2*d, where d denotes the first distance, along a direction inclined by 45 degrees with respect to the first and second directions D1 and D2.

Accordingly, the number of the third light emitting groups BPXG per unit area may be twice the number of the first light emitting groups GPXG or the second light emitting groups RPXG. This is because life of the blue light emitting element, which is an organic light emitting material that emits blue light, generally has a shorter lifespan than organic light emitting materials that emit other color light.

The first light emitting group GPXG may include eight of first light emitting portions G included in different pixel units. In other words, the first light emitting group GPXG is divided into eight sub pixels, and eight of the first light emitting portions G in one of the first light emitting group GPXG are included in different pixel units PXU.

The second light emitting group RPXG may include eight of second light emitting portions R included in different pixel units. In other words, the second light emitting group RPXG is divided into eight sub pixels, and eight of the second light emitting portions R in one of the second light emitting group RPXG are included in different pixel units PXU.

The third light emitting group BPXG may include four of third light emitting portions B included in different pixel units. In other words, the third light emitting group BPXG is divided into four sub pixels, and four of the third light emitting portions B in one of the third light emitting group BPXG are included in different pixel units PXU.

In this case, the first light emitting portion G, the second light emitting portion R, and the third light emitting portion B disposed closest to each other may form one pixel unit PXU. The first light emitting portion G, the second light emitting portion R, and the third light emitting portion B of the one pixel unit PXU may be disposed in a triangular shape. In this case, the triangular shape may be a right isosceles triangle.

The first light emitting portion G may emit green light, the second light emitting portion R may emit red light, and the third light emitting portion B may emit blue light.

Each of the first light emitting group GPXG, the second light emitting group RPXG, and the third light emitting group BPXG may have a circular shape.

Here, each of the first light emitting group GPXG, the second light emitting group RPXG, and the third light emitting group BPXG may include a light emitting layer that emits a corresponding color light.

To describe the arrangement of FIG. 2 in a different manner, the display apparatus 10 includes the display area including first, second, third, and fourth columns arranged sequentially in the first direction D1 and first, second, third, and fourth rows arranged sequentially in the second direction D2. The first light emitting group GPXG is disposed only in the first and third rows and only in the first and third columns. The second light emitting group RPXG is disposed only in the second and fourth rows and only in the second and fourth columns. The third light emitting group BPXG is disposed in the first to fourth rows and the first to fourth columns. Each of the third light emitting group BPXG is disposed between adjacent light emitting groups of the first light emitting group GPXG or between adjacent light emitting groups of the second light emitting group RPXG. A number of light emitting portions included in each of the third light emitting group BPXG (e.g., 4) is less than a number of light emitting portions included in each of the first light emitting group GPXG or in each of the second light emitting group RPXG (e.g., 8).

The light emitting layer of the first light emitting group GPXG, the second light emitting group RPXG, and the third light emitting group BPXG may be formed by inkjet printing, nozzle printing, gravure printing, screen printing, spraying, or electrostatic spray printing method. For example, the light emitting layer may be selectively deposited by a droplet deposition or inkjet printing method.

According to the present exemplary embodiment, one light emitting group includes a plurality of light emitting portions each included in a plurality of pixels. Since the light emitting portions, e.g., the sub pixels, may be formed in a higher resolution than a resolution in patterning the light emitting layer of the one light emitting group, a higher resolution display apparatus may be implemented than the patterning resolution of the light emitting layer. In particular, the first light emitting group GPXG and the second light emitting group RPXG may be divided into eight light emitting portions, and the third light emitting group BPXG may be divided into four light emitting portions, as described above. Therefore, a resolution of four times the patterning resolution of the light emitting layer may be implemented.

FIG. 3A is a cross-sectional view corresponding to one first light emitting group of the display apparatus of FIG. 2 according to an exemplary embodiment of the inventive concept.

Referring to FIGS. 2 and 3A, the display apparatus 10 may include a thin film transistor substrate 100, a first pixel electrode 110a and a second pixel electrode 110b disposed on the thin film transistor substrate 100, a light emitting group defining layer PDL1, a light emitting portion defining layer PDL2, a light emitting layer 120, and a opposite electrode 130.

The thin film transistor substrate 100 may include a substrate, a wiring layer disposed on the substrate, and a plurality of thin film transistors. For example, the wiring layer may include a plurality of gate lines and a plurality of data lines crossing the gate lines. The thin film transistors may be electrically connected to the gate lines and the data lines.

The display apparatus 10 may include the first light emitting group GPXG, a second light emitting group (e.g., RPXG), and a third light emitting group (e.g., BPXG) on the thin film transistor substrate 100. The first light emitting group GPXG may include eight first light emitting portions G included in different pixel units. The second light emitting group may include eight second light emitting portions included in different pixel units (see FIG. 2). The third light emitting group may include four third light emitting portions included in different pixel units (see FIG. 2).

The first light emitting group GPXG may include eight pixel electrodes 110a and 110b corresponding to the eight first light emitting portions G, one light emitting layer 120 overlapping all of the eight pixel electrodes, and the opposite electrode 130 overlapping the light emitting layer 120.

In the drawing, the first pixel electrode 110a and the second pixel electrode 110b of the pixel electrodes are shown. Each of the first pixel electrode 110a and the second pixel electrode 110b may be formed to correspond to a light emitting portion corresponding to one sub pixel, and may be spaced apart from each other.

The light emitting group defining layer PDL1 may be disposed on the thin film transistor substrate 100. An opening corresponding to each of the light emitting groups may be formed.

The first pixel electrode 110a and the second pixel electrode 110b may be disposed in the light emitting group defining layer PDL1.

The light emitting portion defining layer PDL2 may be further disposed in the light emitting group defining layer PDL1 on the thin film transistor substrate 100 on which the first pixel electrode 110a and the second pixel electrode 110b are disposed. The light emitting portion defining layer PDL2 may define the light emitting portion group between the first pixel electrode 110a and the second pixel electrode 110b, and between the first or second pixel electrodes 110a and 110b and the light emitting group defining layer PDL1. The light emitting portion defining layer PDL2 may expose upper surfaces of the first pixel electrode 110a and the second pixel electrode 110b, and include a lyophilic material. For example, the light emitting portion defining layer PDL2 may include an inorganic insulating material.

The light emitting layer 120 may be disposed in the opening of the light emitting group defining layer PDL1. The light emitting group defining layer PDL1 may include a liquid repellent material. For example, the light emitting group defining layer PDL1 may include an organic insulating material. Therefore, when the light emitting layer 120 is formed by a method such as inkjet printing, it is possible to prevent the light emitting layer 120 from being formed in an unwanted area.

On the other hand, the material included in the light emitting layer 120 is not particularly limited. The light emitting layer 120 may be formed using organic light emitting materials capable of emitting red, green, or blue wavelengths by a fluorescence or phosphorescence mechanism.

For example the light emitting layer 120 may be formed using an inkjet printing, nozzle printing, gravure printing, screen printing, spray printing, or electrostatic spray printing method.

For example, the light emitting layer 120 may be selectively deposited by droplet deposition or inkjet printing.

The display apparatus 10 may further include a thin film encapsulation layer disposed on the opposite electrode 130. The thin film encapsulation layer may prevent penetration of moisture and oxygen from outside. The thin film encapsulation layer may include at least one organic layer and at least one inorganic layer. The at least one organic layer and the at least one inorganic layer may be alternately stacked with each other. For example, the thin film encapsulation layer may include two inorganic layers and one organic layer therebetween, but is not limited thereto. In exemplary embodiments of the inventive concept, it is possible to provide a sealing substrate for shielding outside air and moisture from penetrating into the display apparatus 10 instead of the thin film encapsulation layer.

Figure 3B:
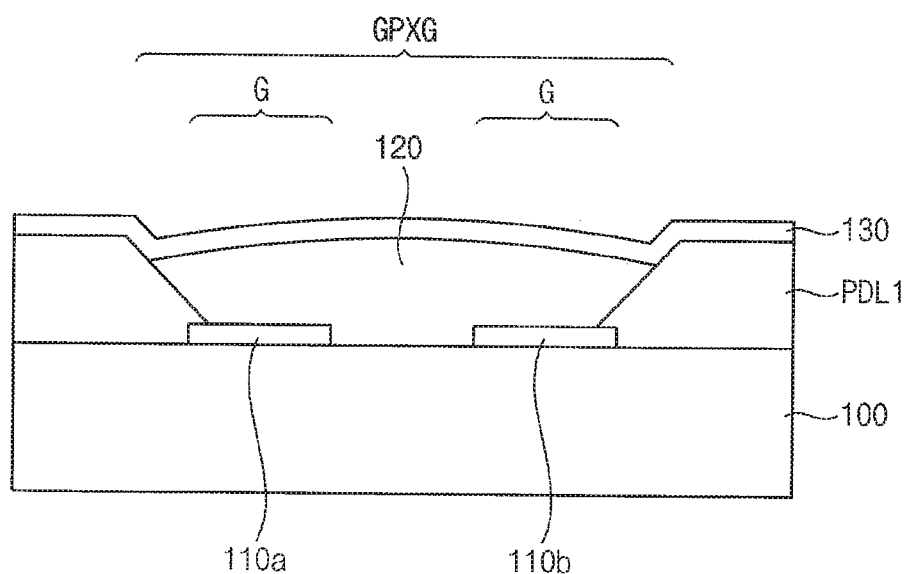
FIG. 3B is a cross-sectional view corresponding to one first light emitting group of the display apparatus of FIG. 2 according to an exemplary embodiment of the inventive concept.

FIG. 3B is a cross-sectional view corresponding to one first light emitting group of the display apparatus of FIG. 2 according to an exemplary embodiment of the inventive concept.

Referring to FIG. 3B, the display apparatus is substantially the same as the display apparatus of FIG. 3A except that the light emitting part defining layer is not included.

Therefore, repeat descriptions will be omitted.

Here, the light emitting group defining layer PDL1 of the display apparatus 10 may include a liquid-repellent material. An upper surface of the thin film transistor substrate 100 and/or upper surfaces of first and second pixel electrodes 110a and 110b may include a lyophilic material.

Figure 4:
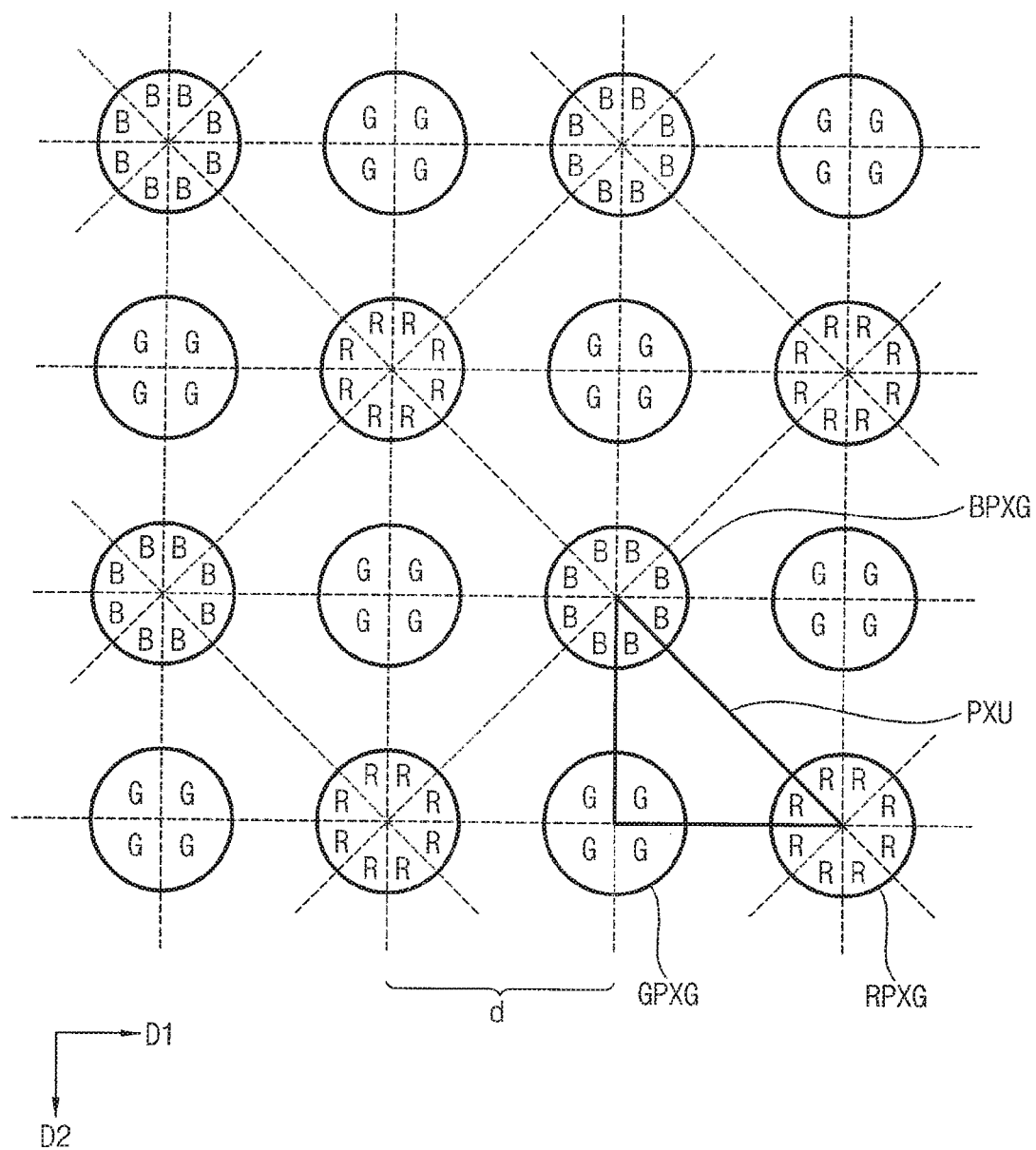
FIG. 4 is a plan view illustrating a portion of an arrangement of pixel units according to an exemplary embodiment of the inventive concept.

FIG. 4 is a plan view illustrating a portion of an arrangement of pixel units according to an exemplary embodiment of the inventive concept.

Referring to FIG. 4, the display apparatus is substantially the same as the display apparatus of FIG. 2, except that the first light emitting group GPXG is divided into four first light emitting portions G emitting green light, the second light emitting group RPXG is divided into eight second light emitting portions R emitting red light, and the third light emitting group BPXG is divided into eight third light emitting portions B emitting blue light. Therefore, repeat descriptions will be omitted.

The first light emitting group GPXG, the second light emitting group RPXG, and the third light emitting group BPXG may be formed in plural, and may be arranged in a matrix along the first direction D1 and the second direction D2.

The first light emitting group GPXG may include four first light emitting potions G included in different pixel units. The second light emitting group RPXG may include eight second light emitting potions R included in different pixel units. The third light emitting group BPXG may include eight third light emitting potions B included in different pixel units.

Accordingly, the number of the first light emitting groups GPXG per unit area may be twice that of the second light emitting groups RPXG or the third light emitting groups BPXG.

Figure 5:
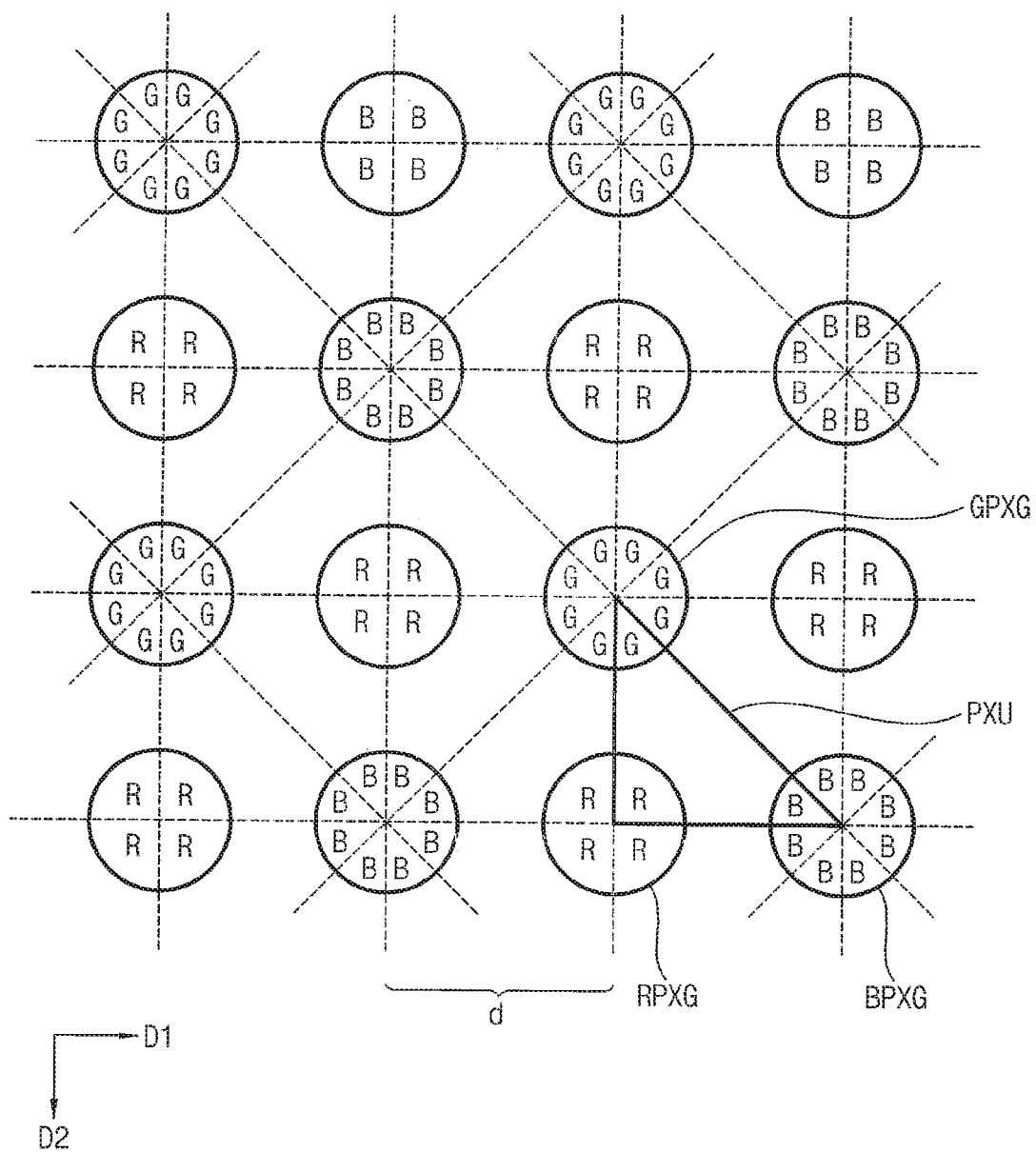
FIG. 5 is a plan view illustrating a portion of an arrangement of pixel units according to an exemplary embodiment of the inventive concept.

FIG. 5 is a plan view illustrating a portion of an arrangement of pixel units according to an exemplary embodiment of the inventive concept.

Referring to FIG. 5, the display apparatus is substantially the same as the display apparatus of FIG. 2, except that the first light emitting group GPXG is divided into eight first light emitting portions G emitting green light, the second light emitting group RPXG is divided into four second light emitting portions R emitting red light, and the third light emitting group BPXG is divided into eight third light emitting portions B emitting blue light. Therefore, repeat descriptions will be omitted.

The first light emitting group GPXG, the second light emitting group RPXG, and the third light emitting group BPXG may be formed in plural, and may be arranged in a matrix along the first direction D1 and the second direction D2.

The first light emitting group GPXG may include eight first light emitting potions G included in different pixel units. The second light emitting group RPXG may include four second light emitting potions R included in different pixel units. The third light emitting group BPXG may include eight third light emitting potions B included in different pixel units.

Accordingly, the number of the second light emitting groups RPXG per unit area may be twice that of the first light emitting groups GPXG or the third light emitting groups BPXG.

Figure 6:
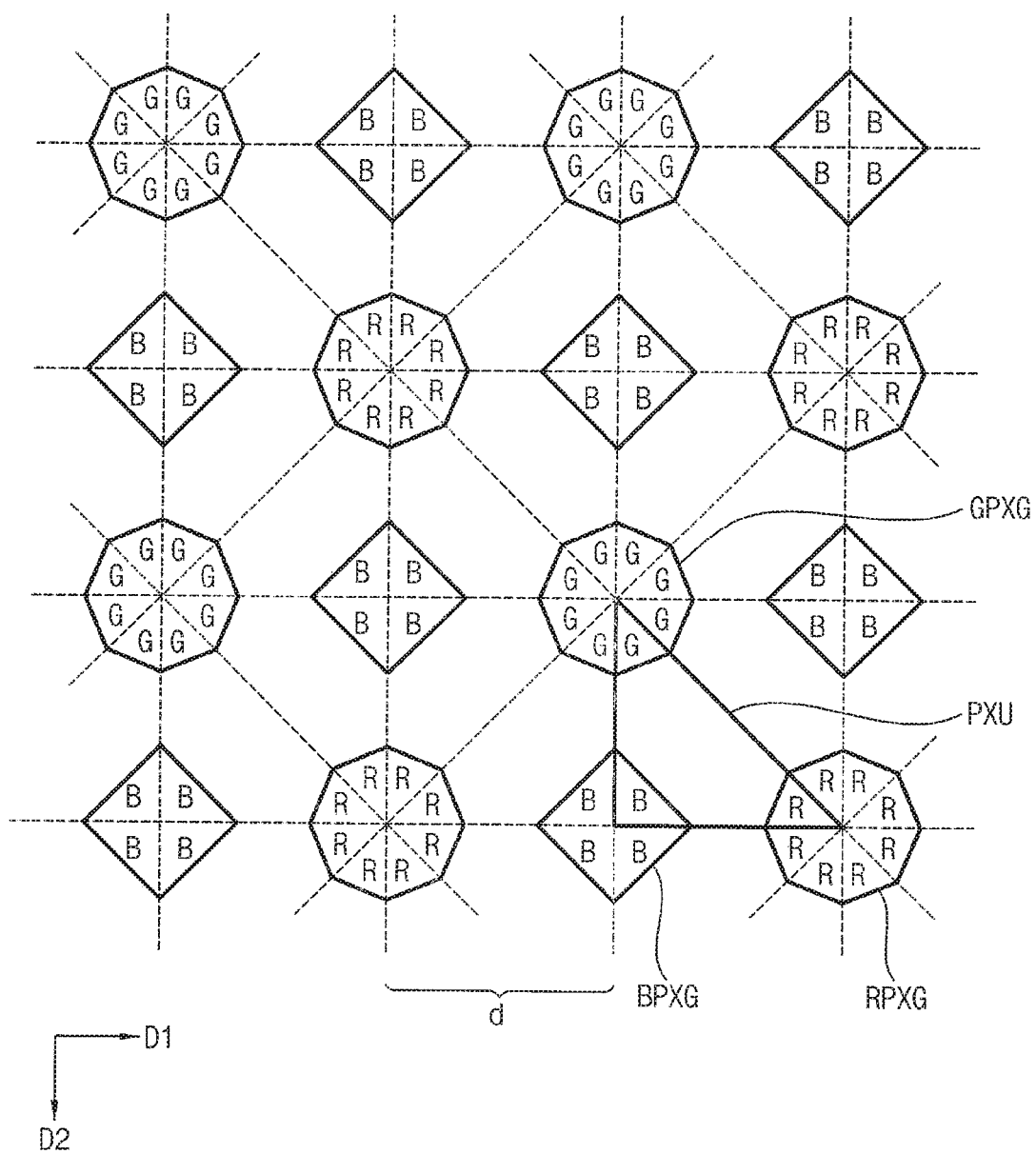
FIG. 6 is a plan view illustrating a portion of an arrangement of pixel units according to an exemplary embodiment of the inventive concept.

FIG. 6 is a plan view illustrating a portion of an arrangement of pixel units according to an exemplary embodiment of the inventive concept.

Referring to FIG. 6, the display apparatus is substantially the same as the display apparatus of FIG. 2 except that each of the first light emitting group GPXG, the second light emitting group RPXG, and the third light emitting group BPXG have a polygonal shape. Therefore, repeat descriptions will be omitted.

Each of the first light emitting group GPXG and the second light emitting group RPXG may have an octagonal shape. The third light emitting group BPXG may have a quadrangular shape.

Figure 7:
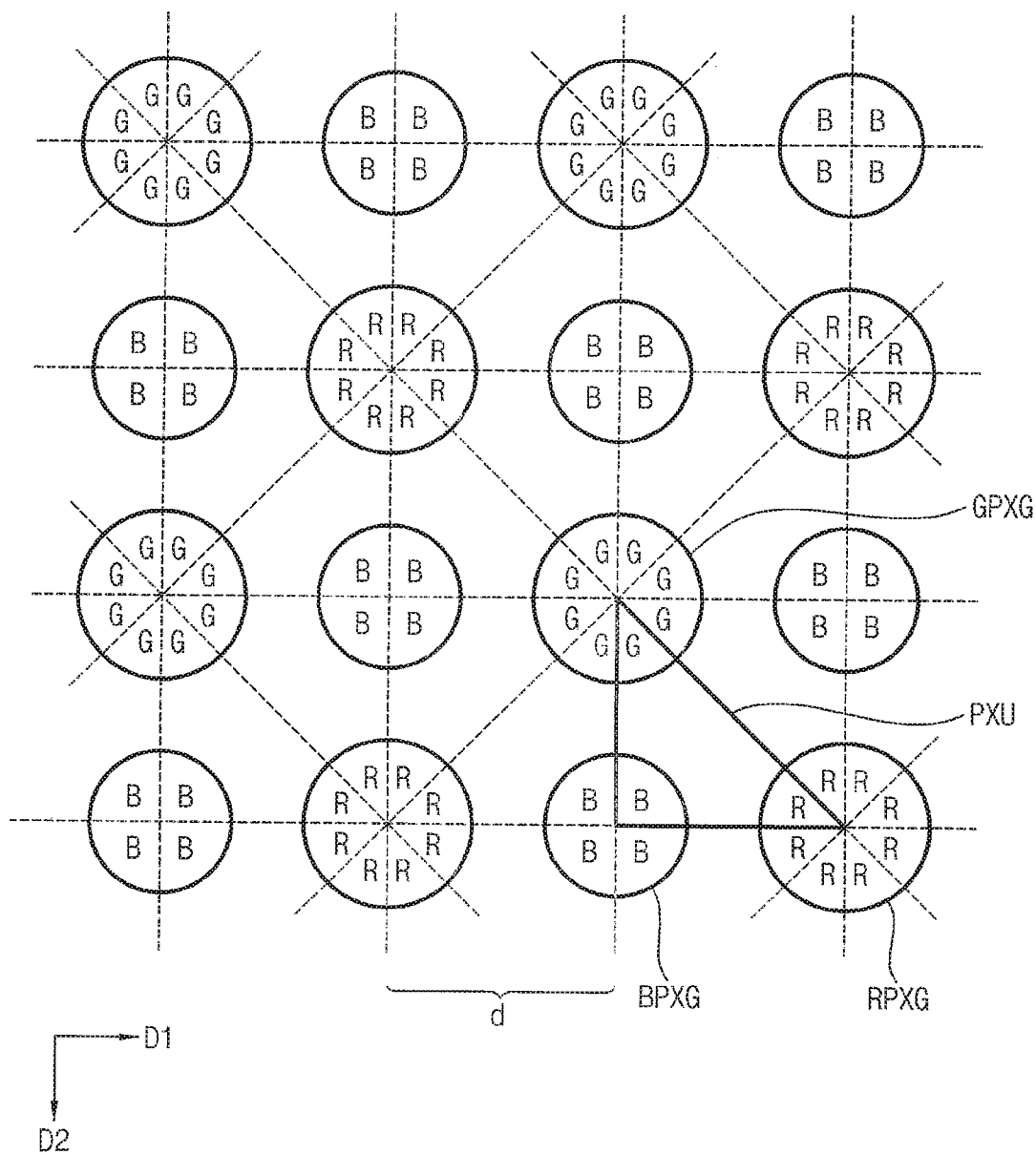
FIG. 7 is a plan view illustrating a portion of an arrangement of pixel units according to an exemplary embodiment of the inventive concept.

FIG. 7 is a plan view illustrating a portion of an arrangement of pixel units according to an exemplary embodiment of the inventive concept.

Referring to FIG. 7, the display apparatus is substantially the same as the display apparatus of FIG. 2, except that at least one of a first light emitting group (e.g., GPXG), a second light emitting group (e.g., RPXG), and a third light emitting group (e.g. BPXG) has a different size from the other two. Therefore, repeat descriptions will be omitted.

In the present exemplary embodiment, the number per unit area of the third light emitting group BPXG including the third light emitting portion B emitting blue light is twice the number per unit area of the first light emitting group GPXG including the first light emitting portion G emitting green light or the number per unit area of the second light emitting group RPXG including the second light emitting portion R emitting red light. To make the emitting area uniform for each color light, the size of the third light emitting group BPXG may be smaller than that of the first light emitting group GPXG and the second light emitting group RPXG.

According to the present exemplary embodiment, the display apparatus includes a plurality of light emitting groups. One light emitting group includes a plurality of light emitting portions each included in a plurality of pixels. Since the light emitting portions, e.g., the sub pixels, may be formed in a higher resolution than a resolution in patterning the light emitting layer of the one light emitting group, a higher resolution display apparatus may be implemented than the patterning resolution of the light emitting layer. In particular, the first light emitting group and the second light emitting group may be divided into eight light emitting portions, and the third light emitting group may be divided into four light emitting portions. Therefore, a resolution of four times than the patterning resolution of the light emitting layer may be implemented.

Figure 8:
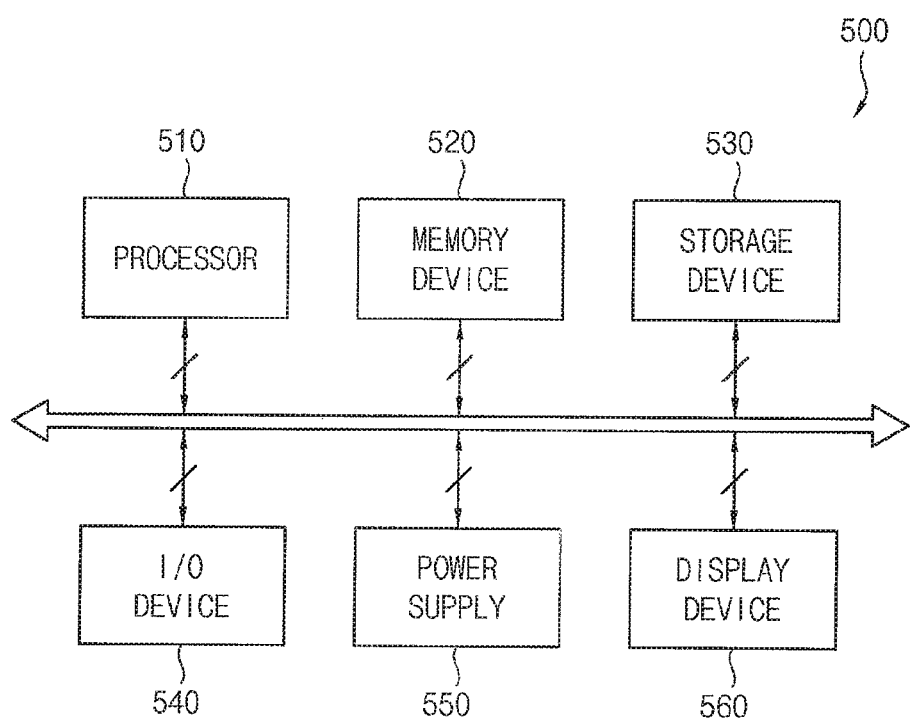
FIG. 8 is a block diagram illustrating an electronic device according to an exemplary embodiment of the inventive concept.
Figure 9A:
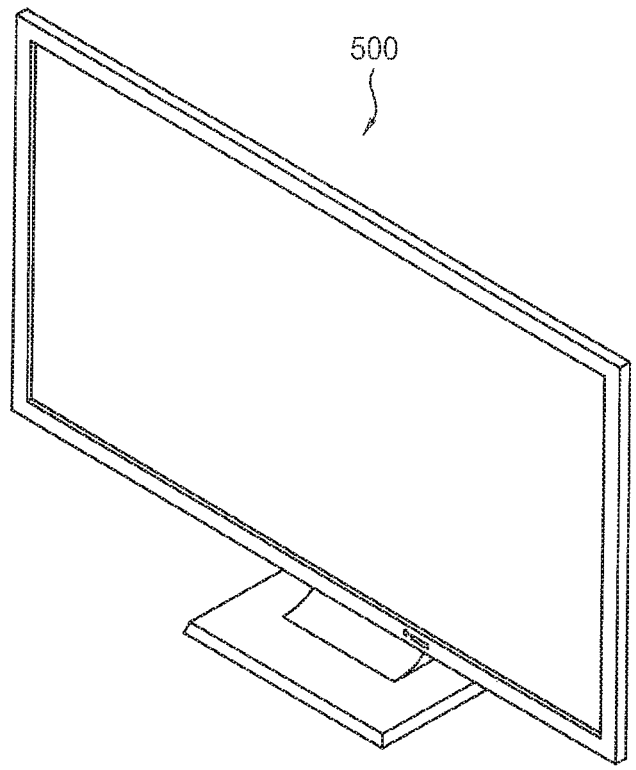
FIG. 9A is a diagram illustrating an example in which the electronic device of FIG. 8 is implemented as a television according to an exemplary embodiment of the inventive concept.
Figure 9B:
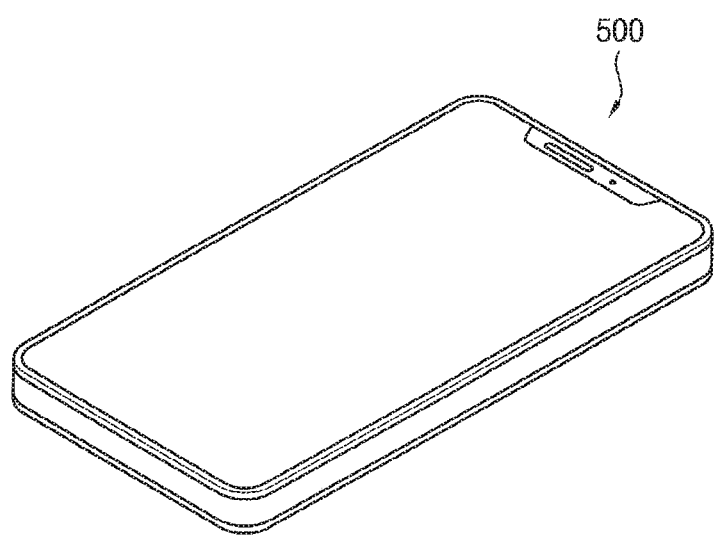
FIG. 9B is a diagram illustrating an example in which the electronic device of FIG. 8 is implemented as a smart phone according to an exemplary embodiment of the inventive concept.

FIG. 8 is a block diagram illustrating an electronic device according to an exemplary embodiment of the inventive concept. FIG. 9A is a diagram illustrating an example in which the electronic device of FIG. 8 is implemented as a television according to an exemplary embodiment of the inventive concept. FIG. 9B is a diagram illustrating an example in which the electronic device of FIG. 8 is implemented as a smart phone according to an exemplary embodiment of the inventive concept.

Referring to FIGS. 8 through 9B, an electronic device 500 may include a processor 510, a memory device 520, a storage device 530, an input/output (I/O) device 540, a power supply 550, and a display apparatus 560. Here, the display apparatus 560 may correspond to the display apparatus according to exemplary embodiments of the inventive concept described above. In addition, the electronic device 500 may further include a plurality of ports for communicating with a video card, a sound card, a memory card, a universal serial bus (USB) device, other electronic devices, etc. In an exemplary embodiment of the inventive concept, as illustrated in FIG. 9A, the electronic device 500 may be implemented as a television. In an exemplary embodiment of the inventive concept, as illustrated in FIG. 9B, the electronic device 500 may be implemented as a smart phone. However, the electronic device 500 is not limited thereto. For example, the electronic device 500 may be implemented as a cellular phone, a video phone, a smart pad, a smart watch, a tablet personal computer (PC), a car navigation system, a computer monitor, a laptop, a head mounted display (HMD), etc.

The processor 510 may perform various computing functions. The processor 510 may be a micro processor, a central processing unit (CPU), an application processor (AP), etc.

The processor 510 may be coupled to other components via an address bus, a control bus, a data bus, etc. Further, the processor 510 may be coupled to an extended bus such as a peripheral component interconnect (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display apparatus 560 may be coupled to other components via the buses or other communication links. In exemplary embodiments of the inventive concept, the display apparatus 560 may be included in the I/O device 540. As described above, one light emitting group of the display apparatus 560 includes a plurality of light emitting portions each included in a plurality of pixels. Since the light emitting portions, e.g., the sub pixels, may be formed in a higher resolution than a resolution in patterning the light emitting layer of the one light emitting group, a higher resolution display apparatus may be implemented than the patterning resolution of the light emitting layer. In particular, a first light emitting group and a second light emitting group may be divided into eight light emitting portions, and a third light emitting group may be divided into four light emitting portions. Therefore, a resolution of four times than the patterning resolution of the light emitting layer may be implemented.

However, since this has been described above, a duplicate description thereof will be omitted.

The inventive concept can be applied to organic light emitting display devices and various electronic devices including the same. For example, the inventive concept can be applied to a mobile phone, a smart phone, a video phone, a smart pad, a smart watch, a tablet PC, a car navigation system, a television, a computer monitor, a notebook, or the like.

As described above, according to exemplary embodiments of the inventive concept, a display apparatus includes a plurality of light emitting groups. One light emitting group includes a plurality of light emitting portions each included in a plurality of pixels. Since the light emitting portions, e.g., the sub pixels, may be formed in a higher resolution than a resolution in patterning the light emitting layer of the one light emitting group, a higher resolution display apparatus may be implemented than the patterning resolution of the light emitting layer. In particular, a first light emitting group and a second light emitting group may be divided into eight light emitting portions, and a third light emitting group may be divided into four light emitting portions. Therefore, a resolution of four times the patterning resolution of the light emitting layer may be implemented.

While the inventive concept has been shown and described with reference to exemplary embodiments thereof, it will be understood by those of ordinary skill in the art that various changes in forms and details may be made thereto without departing from the spirit and scope of the inventive concept as set forth by the appended claims.

What is claimed is:

1. A display apparatus comprising pixel units each of which includes a first light emitting portion, a second light emitting portion, and a third light emitting portion, each emitting a different color light, comprising:
   a thin film transistor substrate;
   a first light emitting group disposed on the thin film transistor substrate and including eight first light emitting portions included in different pixel units;
   a second light emitting group disposed on the thin film transistor substrate and including eight second light emitting portions included in different pixel units;
   a third light emitting group disposed on the thin film transistor substrate and including four third light emitting portions included in different pixel units;
   a first pixel unit having a triangular shape including two short sides extending in a first direction and a second direction, respectively; and
   a second pixel unit adjacent to the first pixel unit in the first direction and having a triangular shape, wherein a hypotenuse of the second pixel unit faces a hypotenuse of the first pixel unit.

2. A display apparatus comprising pixel units each of which includes a first light emitting portion, a second light emitting portion, and a third light emitting portion, each emitting a different color light, comprising:
   a thin film transistor substrate;
   a first light emitting group disposed on the thin film transistor substrate and including eight first light emitting portions included in different pixel units;
   a second light emitting group disposed on the thin film transistor substrate and including eight second light emitting portions included in different pixel units; and
   a third light emitting group disposed on the thin film transistor substrate and including four third light emitting portions included in different pixel units,
   wherein the first light emitting group, the second light emitting group, and the third light emitting group are formed in plural as first light emitting groups, second light emitting groups, and third light emitting groups, respectively, and arranged in a matrix form along a first direction and a second direction crossing the first direction on the thin film transistor substrate,
   wherein four first light emitting groups closest to one another is arranged in a repeating square shape,
   wherein four second light emitting groups closest to one another is arranged in a repeating square shape,
   wherein four third light emitting groups closest to one another is arranged in a repeating square shape inclined by about 45 degrees with respect to the first direction and the second direction, and
   the number of the third light emitting groups per unit area is twice the number of the first or second light emitting groups.

3. The display apparatus of claim 2, wherein centers of two light emitting groups adjacent to each other among the first to third light emitting groups are spaced apart from each other by a first distance,
    a distance between centers of two of the first light emitting groups closest to each other is a second distance which is twice the first distance.

4. The display apparatus of claim 2, wherein the first light emitting portion, the second light emitting portion, and the third light emitting portion arranged closest to one another form one pixel unit.

5. The display apparatus of claim 4, wherein the first light emitting portion, the second light emitting portion, and the third light emitting portion of the one pixel unit are arranged in a triangular shape.

6. The display apparatus of claim 5, wherein the triangular shape is a right isosceles triangle.

7. The display apparatus of claim 5, wherein the first light emitting portion emits green light, the second light emitting portion emits red light, and the third light emitting portion emits blue light.

8. The display apparatus of claim 5, wherein the third light emitting portion emits red light or green light.

9. The display apparatus of claim 3, wherein a distance between centers of two of the third light emitting groups closest to each other is larger than the first distance and smaller than the second distance.

10. The display apparatus of claim 1, wherein the first light emitting group comprises eight pixel electrodes corresponding to the eight first light emitting portions, one light emitting layer overlapping all of the eight pixel electrodes, and an opposite electrode overlapping the one light emitting layer.

11. The display apparatus of claim 10, wherein the first light emitting group has a circular or polygonal shape.

12. The display apparatus of claim 10, further comprising:
    a light emitting group defining layer disposed on the thin film transistor substrate and having an opening,
    wherein the one light emitting layer is disposed in the opening of the light emitting group defining layer.

13. The display apparatus of claim 12, further comprising:
    a light emitting portion defining layer disposed in the opening of the light emitting group defining layer,
    wherein the light emitting portion defining layer is disposed between adjacent pixel electrodes of the eight pixel electrodes.

14. The display apparatus of claim 13, wherein the light emitting group defining layer includes a liquid repellent material, and the light emitting portion defining layer includes a lyophilic material.

15. The display apparatus of claim 12, wherein the one light emitting layer is formed by inkjet printing.

16. The display apparatus of claim 1, wherein one of the first light emitting group, the second light emitting group, and the third light emitting group is different in size from the other two.

17. The display apparatus of claim 1, wherein each of the first to third light emitting groups has a circular shape.

\* \* \* \* \*